(12) United States Patent
Abraham et al.

(10) Patent No.: US 8,970,018 B2
(45) Date of Patent: Mar. 3, 2015

(54) DIFFERENTIAL EXCITATION OF PORTS TO CONTROL CHIP-MODE MEDIATED CROSSTALK

(71) Applicant: International Business Machines Corporation, Armonk, NY (US)

(72) Inventors: David W. Abraham, Croton, NY (US); Jay M. Gambetta, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/335,170

(22) Filed: Jul. 18, 2014

(65) Prior Publication Data

US 2014/0327120 A1 Nov. 6, 2014

Related U.S. Application Data

(62) Division of application No. 13/827,977, filed on Mar. 14, 2013, now Pat. No. 8,865,537.

(51) Int. Cl.
*H01L 23/00* (2006.01)
*H01L 23/66* (2006.01)
*H01L 21/56* (2006.01)

(52) U.S. Cl.
CPC ............... *H01L 23/66* (2013.01); *H01L 21/568* (2013.01); *H01L 23/564* (2013.01); *H01L 2224/0231* (2013.01); *H01L 24/80* (2013.01)

USPC ............... 257/664; 257/665; 257/30; 257/31; 257/E21.507; 438/106; 438/215; 438/612; 438/637

(58) Field of Classification Search
CPC .................. H01L 24/80; H01L 23/564; H01L 2224/0231; H01L 2121/568; H01L 2924/01072; H01F 17/0006
USPC ...................... 257/664, 665, 30, 31, E21.507; 438/637, 612, 215
See application file for complete search history.

(56) References Cited

U.S. PATENT DOCUMENTS

| | | | |
|---|---|---|---|
| 5,912,472 A | 6/1999 | Voigtlaender et al. | |
| 6,130,483 A | 10/2000 | Shizuki et al. | |
| 6,232,854 B1 | 5/2001 | Mikami et al. | |
| 2005/0184284 A1 | 8/2005 | Burkard et al. | |
| 2009/0122885 A1* | 5/2009 | Anilkumar et al. | 375/260 |

* cited by examiner

*Primary Examiner* — Thinh T Nguyen
(74) *Attorney, Agent, or Firm* — Cantor Colburn LLP; Vazken Alexanian

(57) ABSTRACT

A differential port and a method of arranging the differential port are described. The method includes arranging a first electrode to receive a drive signal, and arranging a second electrode to receive a guard signal, the guard signal having a different phase than the drive signal and the first electrode and the second electrode having a gap therebetween. The method also includes disposing a signal line from the first electrode to drive a radio frequency (RF) device.

13 Claims, 7 Drawing Sheets

DIFFERENTIAL EXCITATION OF PORTS TO CONTROL CHIP-MODE MEDIATED CROSSTALK

CROSS-REFERENCE TO RELATED APPLICATION

This application is a divisional of U.S. application Ser. No. 13/827,977 filed Mar. 14, 2013, the disclosure of which is incorporated by reference in its entirety.

FEDERAL RESEARCH STATEMENT

This invention was made with Government support under Contract No.: W911NF-10-1-0324 awarded by the U.S. Army. The Government has certain rights in this invention.

BACKGROUND

The present invention relates to a quantum computing chip, and more specifically, to a signal port of the quantum computing chip.

In quantum computing, a quantum bit (qubit) is a quantum oscillator that eventually experiences unwanted decoherence in the form of dephasing and relaxation (T1 and T2 relaxation). Longer coherence times (larger values for T1 and T2) correspond with a longer time to perform quantum operations before the system decoheres. Several factors may contribute to the perturbations in the oscillation and hasten the T1 and T2 relaxation. A circuit comprising the qubits, resonators, and signal ports is formed as a thin film on a substrate. The substrate, typically formed of an insulating material with a high dielectric constant, may be viewed as a microwave resonator with chip resonant modes (chip modes). Signal ports are points on the circuit through which voltage may be applied to drive the circuit and output signals from the circuit are received. The chip modes may facilitate cross talk between ports. This cross talk may contribute to a noisy environment that leads to faster decoherence of the qubits. Further, in a multi-qubit architecture, the cross talk may lead to unwanted interactions between the qubits.

SUMMARY

According to one embodiment of the present invention, a method of arranging a differential port in a quantum computing chip includes arranging a first electrode to receive a drive signal; arranging a second electrode to receive a guard signal, the guard signal having a different phase than the drive signal and the first electrode and the second electrode having a gap therebetween; and disposing a signal line from the first electrode to drive a radio frequency (RF) device.

According to another embodiment of the invention, a differential port in a quantum computing chip includes a first electrode to receive a drive signal; a second electrode to receive a guard signal, the first electrode and the second electrode being arranged to have a gap therebetween and the drive signal being out of phase with the guard signal; and a signal line from the first electrode to drive a radio frequency (RF) device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, cross talk between ports that is mediated by chip modes (substrate resonant frequencies) may contribute to both unwanted single and two qubit interactions and or decoherence perturbations in the oscillation of the qubits. Embodiments of the invention described herein relate to controlling cross talk by driving the ports without injecting energy into the chip modes.

Figure 1:
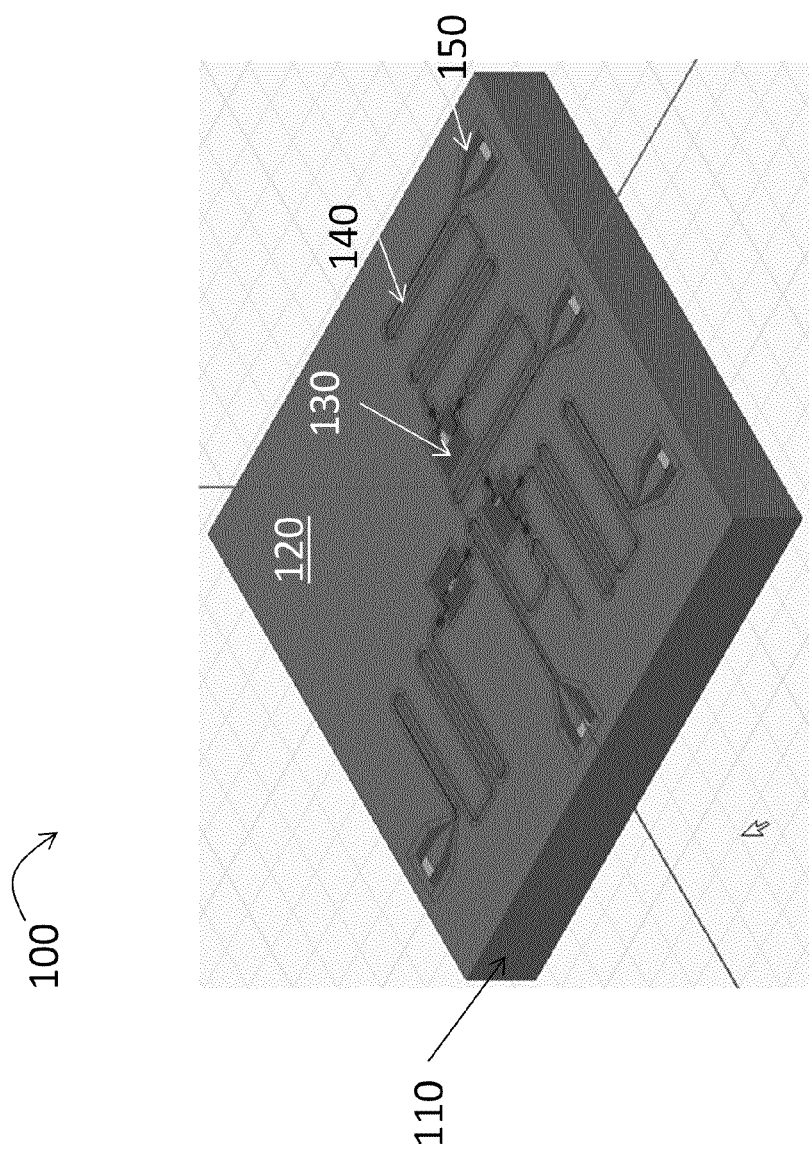
FIG. 1 is a three-dimensional view of a chip according to an embodiment of the invention.

FIG. 1 is a three-dimensional view of a chip 100 according to an embodiment of the invention. The substrate 110 may be a silicon or sapphire wafer. The circuit 120 is patterned as thin metal and insulating films on top of the substrate 110. The circuit 120 includes qubits 130 that are interrogated by microwave pulses through their interaction with microwave resonators 140. The circuit 120 also includes ports 150 through which drive signals are introduced and output signals of the circuit 120 are received. Coupling of spurious energy into the qubit 130 may be caused by the resonators 140 or another energy reservoir such as chip modes. Crosstalk between the ports 150, mediated by the chip modes, may also contribute to accelerated decoherence and or unwanted interactions of the qubits 130.

Figure 2:
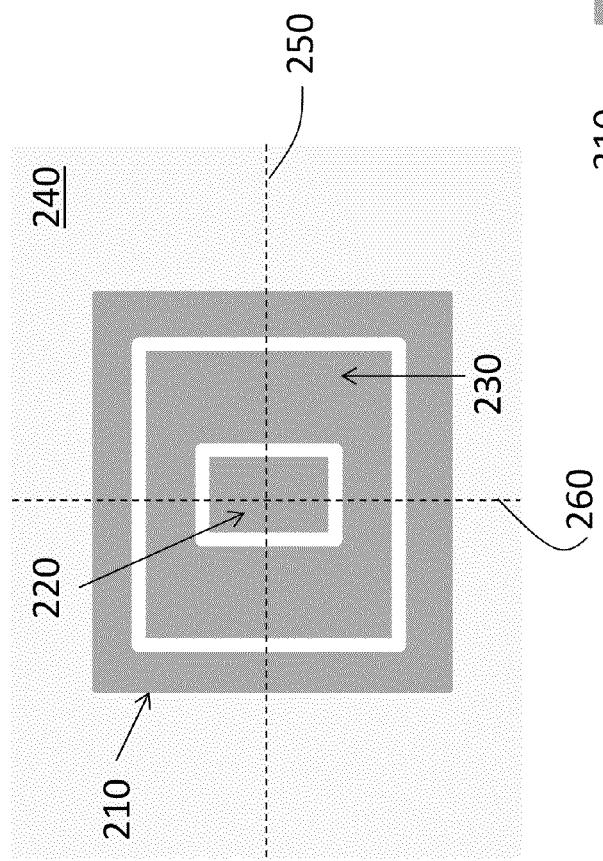
FIG. 2 depicts a differential port according to an embodiment of the invention.

FIG. 2 depicts a differential port 210 according to an embodiment of the invention. The differential port 210 may be regarded as a combination of two ports that are driven by signals that are out of phase with each other. The signal applied to the inner electrode 220 may be 180 degrees out of phase with the signal applied to the outer electrode 230. In alternate embodiments discussed further below, the signals applied to the inner electrode 220 and the outer electrode 230 may be out of phase by varying degrees. The signal applied to the inner electrode 220 may have the same amplitude as the signal applied to the outer electrode 230. In alternate embodiments discussed further below, the signals applied to the inner electrode 220 and the outer electrode 230 may have different amplitudes. Exciting the differential port 210 with out of phase signals controls the energy that is driven into the chip mode (of the substrate 240 on which the differential port 210 is placed) by essentially cancelling out the signals. That is, one of the signals is used to drive a resonator (140, FIG. 1) while the other signal cancels out the drive signal to some extent, if not completely, to prevent driving the chip mode frequencies. By not energizing chip mode frequencies, the differential port 210 controls crosstalk which occurs when a signal propagates from a port 150 (FIG. 1) and is carried by substrate 110 chip modes to another port 150. If the two ports were driven by signals that are in phase with each other, the differential port 210 would instead be a common-mode port, which would likely exacerbate the crosstalk. As noted above, the application of signals that are out of phase with each other to the inner electrode 220 and outer electrode 230 of the differential port 210 reduces the energy introduced into the chip mode (and thereby reduces crosstalk). However, the inner electrode 220 and outer electrode 230 are of different sizes and shapes and, therefore, have different capacitance to ground. Further, the inner electrode 220 and outer electrode 230 may not be completely symmetrical (about an intersection of two perpendicular lines 250, 260) as they are in FIG. 2. That is, the inner electrode 220 and the outer electrode 230 may not be in complete alignment with each other, and, as a result, signals that are 180 degrees out of phase with each other may not cancel each other out completely and prevent all energy from being injected into the chip mode (i.e., may not completely eliminate crosstalk). In fact, when a signal line is added to one of the electrodes, as discussed below, the symmetry shown in FIG. 2, for example, cannot be maintained. These issues may be addressed as detailed below.

Figure 3:
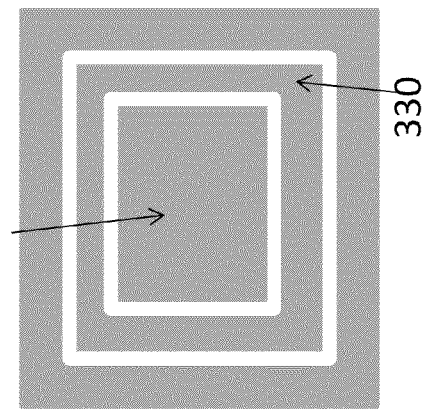
FIG. 3 depicts a differential port according to an embodiment of the invention.

FIG. 3 depicts a differential port 310 according to an embodiment of the invention. The inner electrode 320 is adjusted in size to more closely approximate the size of the outer electrode 330 as compared to the relative size of the inner electrode 220 and outer electrode 230 of the differential port 210 shown in FIG. 2. A comparison of FIGS. 2 and 3 shows that the inner electrode 320 and the outer electrode 330 of FIG. 3 are closer in size to each other than the inner electrode 220 and outer electrode 230 of FIG. 2. As such, the signals applied to the inner electrode 320 and to the outer electrode 330 may cancel out more completely to address crosstalk. Alternately or additionally, the signal applied to the inner electrode 320 may have a larger amplitude than the signal applied to the outer electrode 330 to compensate for the relatively smaller size of the inner electrode 320 with respect to the outer electrode 330. Further, alternately or additionally, the signals applied to the inner electrode 320 and outer electrode 330 may be out of phase by a phase angle other than 180 degrees. An angle other than 180 degrees may account for the lack of symmetry noted above between the inner electrode 320 and the outer electrode 330. Thus, depending on the degree of misalignment between the inner electrode 320 and the outer electrode 330, signals that are out of phase by some phase angle other than 180 degrees may prevent energy from being injected into the chip mode and thereby prevent crosstalk that contributes to decoherence and unwanted interactions of the qubits.

Figure 5:
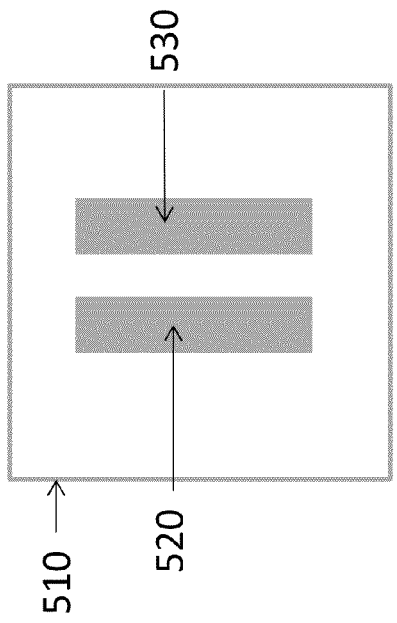
FIG. 5 depicts a differential port according to an embodiment of the invention.
Figure 4:
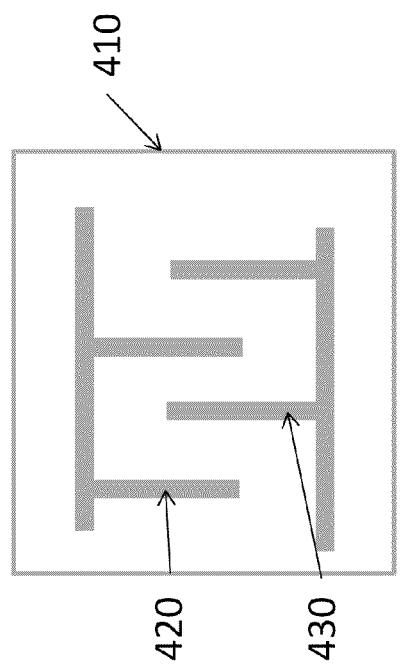
FIG. 4 depicts a differential port according to an embodiment of the invention.
Figure 6:
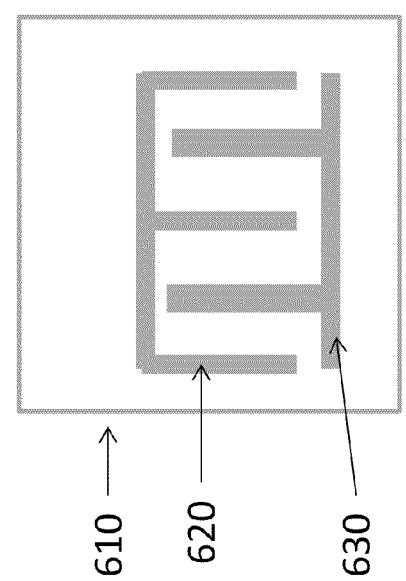
FIG. 6 depicts a differential port according to an embodiment of the invention.

FIGS. 4-6 depict differential ports 410, 510, 610 according to embodiments of the invention. Each of the embodiments shown in the figures includes a different arrangement for two electrodes comprising the differential port (410, 510, 610). In FIG. 4, the first electrode 420 and the second electrode 430 of the differential port 410 (FIG. 4) include parallel elements but one of the electrodes is not placed within the other. This is also the case for the first electrode 620 and the second electrode 630 of the differential port 610 (FIG. 6). For differential port 510 (FIG. 5), the first electrode 520 and the second electrode 530 are formed as parallel bars. The arrangement of the first electrodes (420, 520, 620) and second electrodes (430, 530, 630) in FIGS. 4-6 are less symmetric tan the arrangement of the inner electrodes (220, 320) and outer electrodes (230, 330) in FIGS. 2 and 3. The arrangements shown in FIGS. 4-6 may pertain to cases in which crosstalk is frequency dependent. That is, only chip modes of the same symmetry as either the first electrodes (420, 520, 620) or the second electrodes (430, 530, 630), whichever are used to drive the resonator (140, FIG. 1), are excited. Thus, if the signal applied to the other electrode (the one not driving the resonator) sufficiently cancels out the signal driving the resonator, the chip mode excitation may be avoided or reduced, and, consequently, crosstalk may be avoided or reduced. Any of the embodiments of differential ports 210, 310, 410, 510, 610 shown in FIGS. 2-6 may be used on a chip (100, FIG. 1). The signal applied to one of the electrodes may be considered a drive signal that drives the resonator (140, FIG. 1), for example. The other signal applied to the other electrode may be considered a guard signal that cancels out the component of the drive signal that would drive chip modes.

Figure 7:
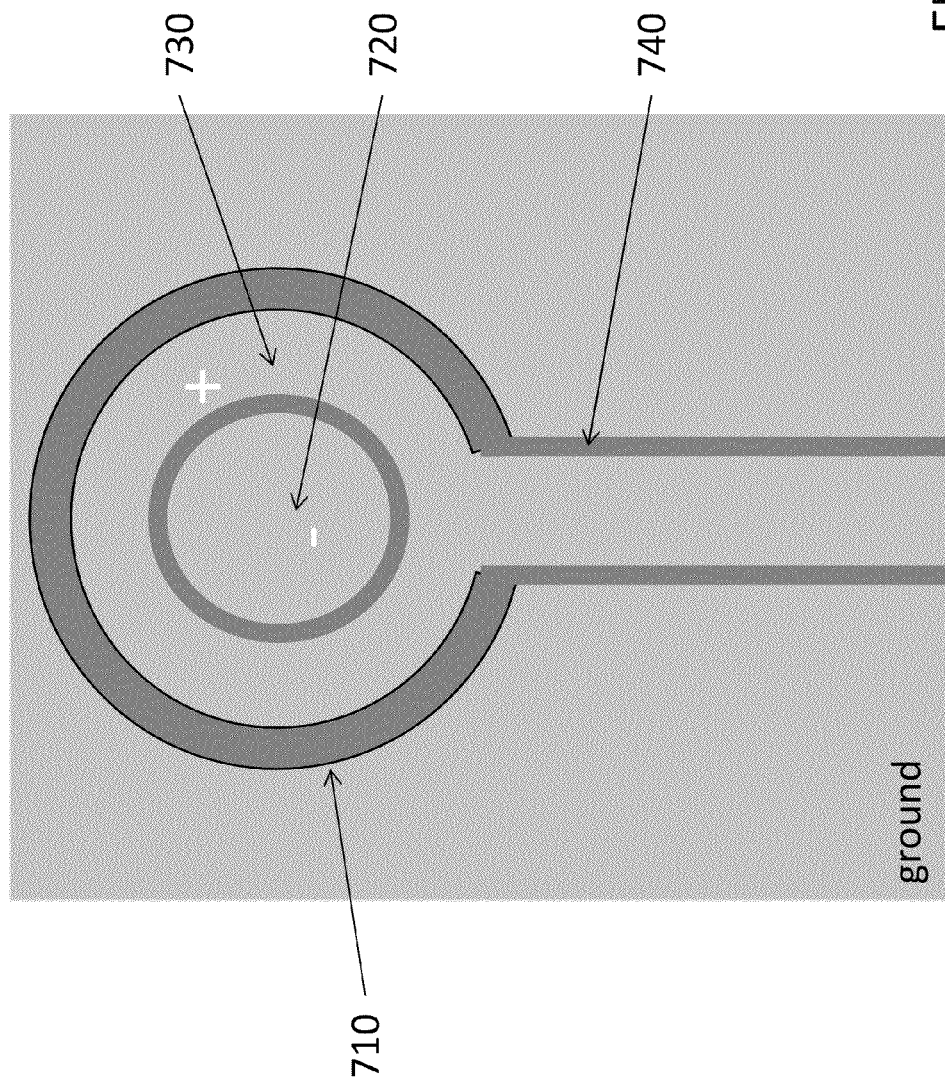
FIG. 7 depicts a differential port according to an embodiment of the invention.

FIG. 7 depicts a differential port 710 according to an embodiment of the invention. The differential port 710 includes a transition (signal line) 740 configured to drive a coplanar waveguide (CPW). In the embodiment of FIG. 7, the outer electrode 730 may be regarded as having the drive signal applied because it connects to the transition 740. The inner electrode 720 may be regarded as having the guard signal applied thereto.

Figure 8:
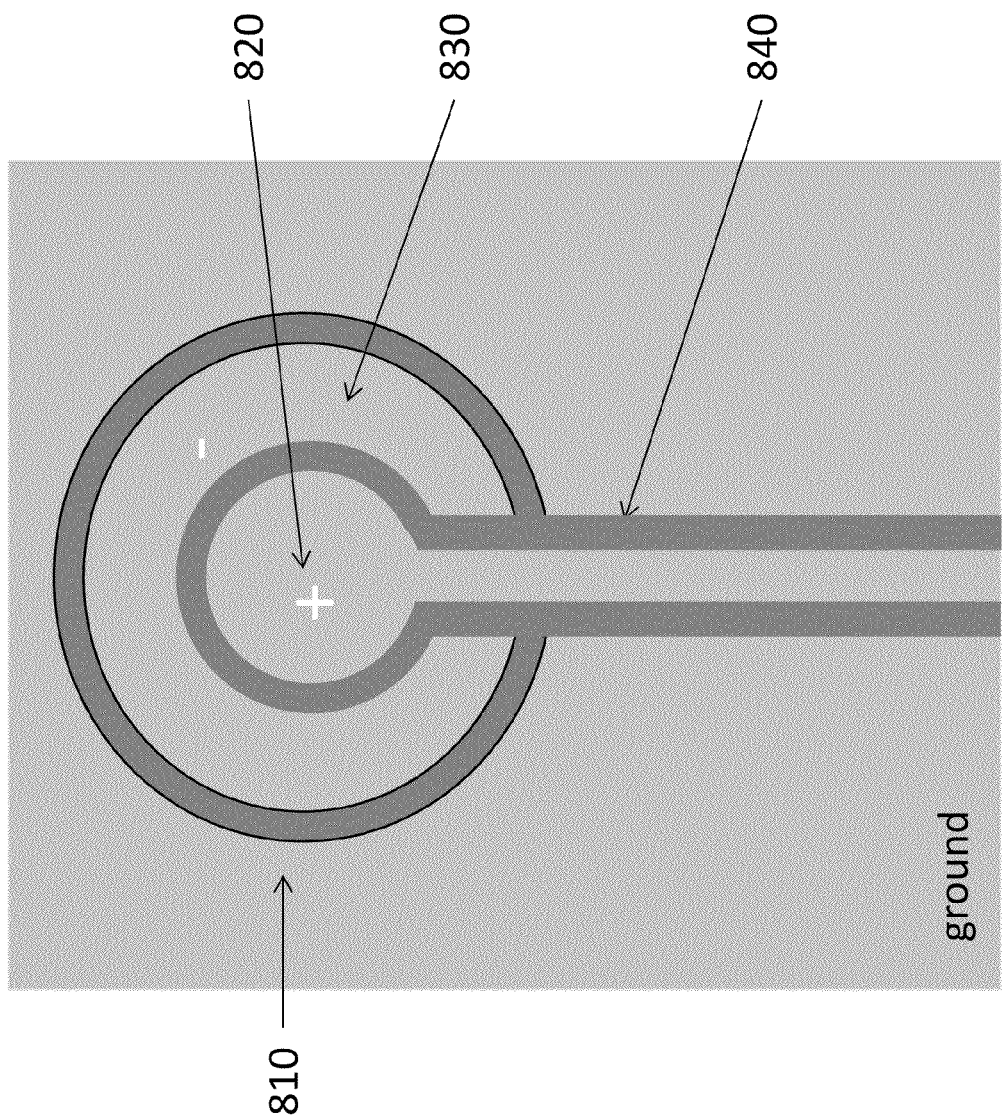
FIG. 8 depicts a differential port according to an embodiment of the invention.

FIG. 8 depicts a differential port 810 according to an embodiment of the invention. In this embodiment, the inner electrode 820 may be regarded as having the drive signal applied because it connects to the transition 840. The outer electrode 830 may be regarded as having the guard signal applied. The electrodes may have an oval shape, as shown for inner and outer electrodes 720, 730 in FIG. 7, for example, or a circular shape, as shown for inner and outer electrodes 820, 830 in FIG. 8, for example. Based on the relative amplitudes and phases of the signals applied and any particular chip mode frequency being targeted, one of the shapes may provide more complete cancellation. The transition 740, 840 or signal line may affect the symmetry between the inner electrode 720, 820 and the outer electrode 730, 830 and, therefore, may also affect the extent to which the drive signal excitation of the chip modes is canceled by the guard signal to some degree. As noted above, any of the previously discussed embodiments of differential ports 210, 310, 410, 510, 610 may have a transition added to use them on a chip.

Figure 9:
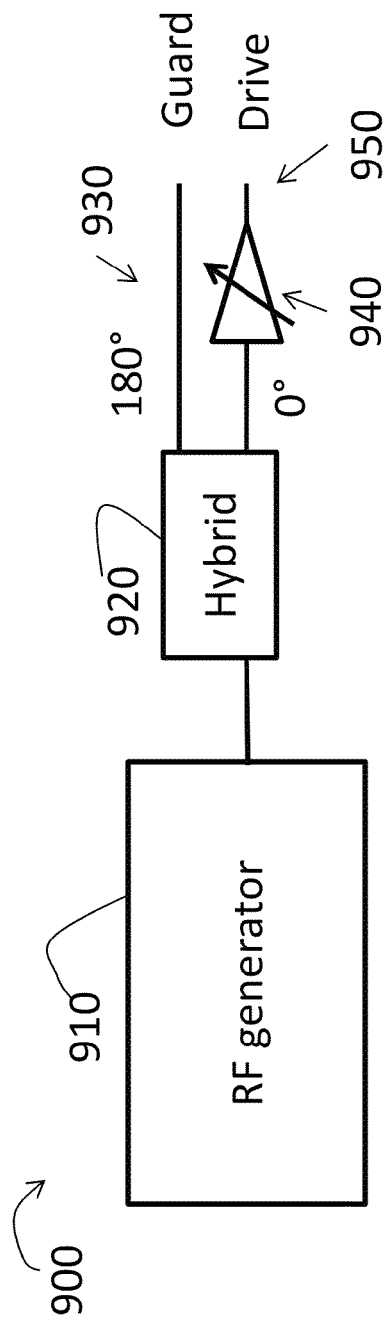
FIG. 9 is a block diagram of a signal generator for a differential port according to an embodiment of the invention.

FIG. 9 is a block diagram of a signal generator 900 for a differential port (210, 310, 410, 510, 610, 710, 810) according to an embodiment of the invention. The signal generator 900 includes a radio frequency (RF) signal source 910 that generates a signal at a desired RF frequency. This RF signal is output to a type of signal splitter 920 that outputs a 180 degree out of phase version of the RF signal as the guard line 930 signal and also outputs the RF signal without a phase change to an amplifier 940 to output an amplitude adjusted drive line 950 signal. The amplitude of the drive line 950 signal may be higher (or lower) than the amplitude of the guard line 930 signal to compensate for differences in the size and shape of the electrodes of the differential port (210, 310, 410, 510, 610, 710, 810), as discussed above. In alternate embodiments, the signal splitter 920 may have an adjustable phase such that the guard line 930 signal is not exactly 180 degrees out of phase with the drive line 950 signal but is, instead, out of phase by a different phase angle. The adjustment in phase difference between the drive line 950 signal and the guard line 930 signal may compensate for misalignment (asymmetry) between the electrodes of the differential port (210, 310, 410, 510, 610, 710, 810). Embodiments discussed above relate to differentially driving a port on the chip (100, FIG. 1), but readout of a signal from the port may also be done differentially, as discussed below.

Figure 10:
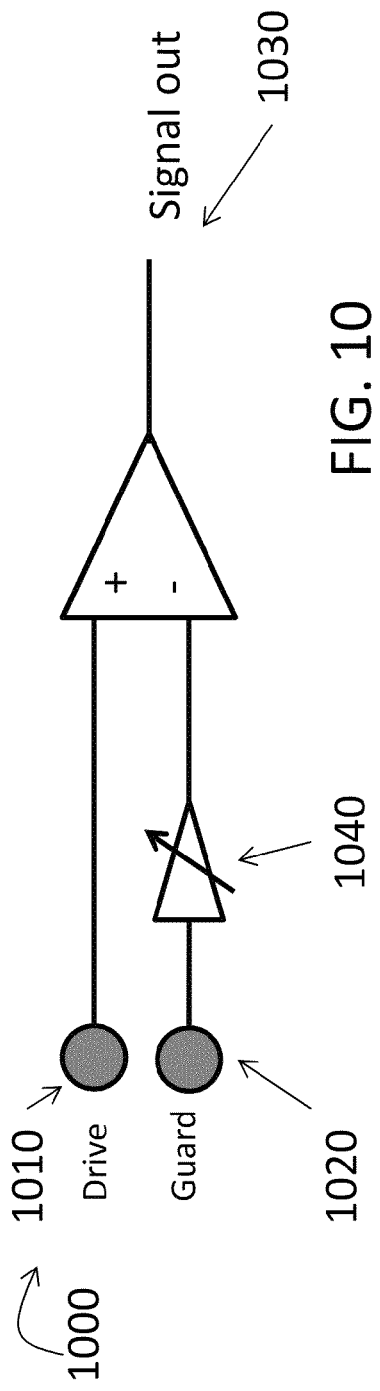
FIG. 10 is a block diagram of a signal readout for a differential port according to an embodiment of the invention.

FIG. 10 is a block diagram of a signal readout 1000 for a differential port (210, 310, 410, 510, 610, 710, 810) according to an embodiment of the invention. The signal readout 1000 includes an input for the signal on the drive line 1010, an input for the signal (noise) on the guard line 1020, and an output 1030 that results from subtracting the guard line 1020 signal from the drive line 1010 signal. The amplifier 1040 may be included in the guard line 1020, as shown. In alternate embodiments the amplifier 1040 may be alternately or additionally included in the drive line 1010.

Figure 11:
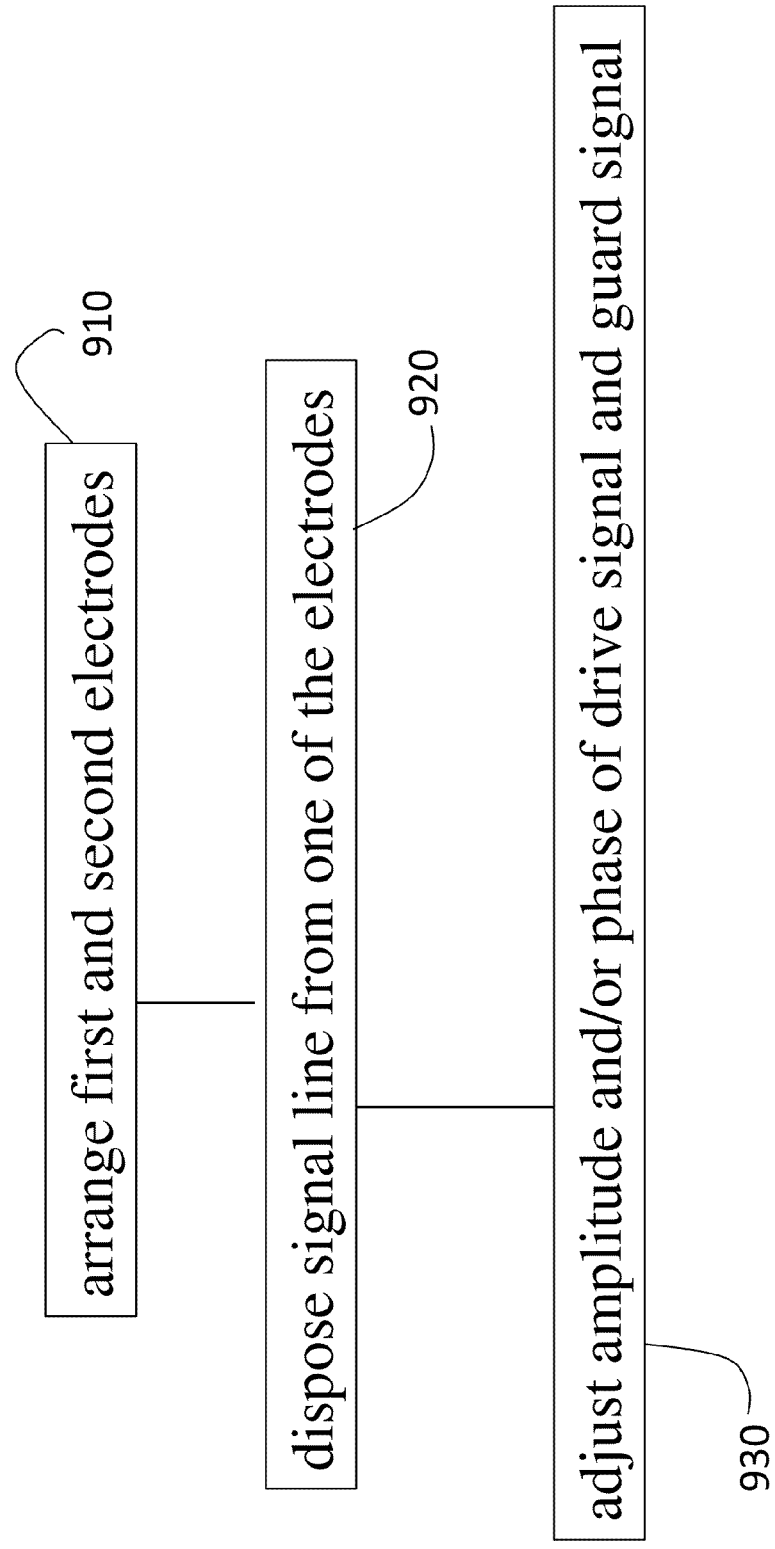
FIG. 11 is a flow diagram of a method of arranging a differential port in a quantum computing chip according to embodiments of the invention.

FIG. 11 is a flow diagram of a method of arranging a differential port in a quantum computing chip according to embodiments of the invention. Arranging the first and second electrodes at block 1110 includes determining the relative size and positioning of the two electrodes as discussed above and shown in the several exemplary embodiments discussed above with reference to FIGS. 2-8. The two electrodes may not contact each other, but their arrangement is not otherwise limited by the exemplary embodiments shown herein. Including a transition (e.g., 740, 840 shown in FIGS. 7 and 8, respectively) from the electrode (730, 820 shown in FIGS. 7 and 8, respectively) to which the drive signal is applied to a coplanar waveguide connects the differential port to the circuit on the chip. That is, a signal line is disposed from one of the electrodes (the one to which the drive signal is applied) so that the differential port may drive an RF component (e.g., resonator 140, FIG. 1) at block 1120. As discussed with reference to several of the exemplary embodiments, in addition to or alternate with adjusting the size and shape of the electrodes, adjusting the amplitude and/or phase of the drive signal and the guard signal at block 1130 may result in more complete cancellation of the differentially applied signals and thereby further reduce crosstalk.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagram depicted herein is just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A differential port in a quantum computing chip, the port comprising:
    a first electrode configured to receive a drive signal;
    a second electrode configured to receive a guard signal, the first electrode and the second electrode being arranged to have a gap therebetween and the drive signal being out of phase with the guard signal; and
    a signal line disposed from the first electrode, configured to drive a radio frequency (RF) device.

2. The port according to claim 1 wherein a size and shape of the first electrode is based on a size and shape of the second electrode.

3. The port according to claim 1, wherein an arrangement of the first electrode is symmetric to an arrangement of the second electrode when the signal line is not considered.

4. The port according to claim 3, wherein the first electrode and the second electrode are arranged as an inner rectangle within an outer rectangle.

5. The port according to claim 4, wherein the first electrode is arranged as the outer rectangle.

6. The port according to claim 3, wherein the first electrode and the second electrode are arranged as an inner circle within an outer circle.

7. The port according to claim 6, wherein the first electrode is arranged as the outer circle.

8. The port according to claim 3, wherein the first electrode and the second electrode are arranged as an inner oval within an outer oval.

9. The port according to claim 8, wherein the first electrode is arranged as the outer oval.

10. The port according to claim 1, wherein the first electrode and the second electrode are arranged based on a chip mode frequency of the quantum computing chip.

11. The port according to claim 1, further comprising a signal generator to generate the drive signal on a drive line connected to the first electrode and the guard signal on a guard line connected to the second electrode, a relative phase and amplitude of the drive signal and the guard signal based on an arrangement of the first electrode and the second electrode.

12. The port according to claim 11, further comprising a signal readout to obtain a signal from the port, the signal readout subtracting a signal received on the guard line from a signal received on the drive line.

13. The port according to claim 12, wherein the signal readout includes an amplifier on one or both of the drive line and the guard line.

* * * * *